US012726178B2

(12) United States Patent
Okada

(10) Patent No.: US 12,726,178 B2
(45) Date of Patent: Sep. 1, 2026

(54) ACOUSTIC WAVE DEVICE

(71) Applicant: Murata Manufacturing Co., Ltd., Nagaokakyo (JP)

(72) Inventor: Takuro Okada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 636 days.

(21) Appl. No.: 18/227,332

(22) Filed: Jul. 28, 2023

(65) Prior Publication Data

US 2023/0370049 A1 Nov. 16, 2023

Related U.S. Application Data

(63) Continuation of application No. PCT/JP2022/017510, filed on Apr. 11, 2022.

(30) Foreign Application Priority Data

Apr. 16, 2021 (JP) ................................ 2021-069675

(51) Int. Cl.
*H03H 9/25* (2006.01)
*H03H 9/145* (2006.01)

(52) U.S. Cl.
CPC .............. *H03H 9/25* (2013.01); *H03H 9/145* (2013.01)

(58) Field of Classification Search
CPC ...... H03H 9/25; H03H 9/145; H03H 9/02858; H03H 9/02559; H03H 9/02866; H03H 9/02574
See application file for complete search history.

(56) References Cited

U.S. PATENT DOCUMENTS 10,886,896 B2 * 1/2021 Yamane .................. H03F 3/195
11,496,226 B2 * 11/2022 Nakagawa ........... H03H 9/0222
11,588,469 B2 * 2/2023 Daimon ............. H03H 9/02866
12,021,500 B2 * 6/2024 Daimon ................... H03H 9/25
12,088,273 B2 * 9/2024 Iwamoto ........... H03H 9/02559
(Continued)

FOREIGN PATENT DOCUMENTS

CN 114830533 A * 7/2022 ......... H03H 9/02574
CN 117917005 A * 4/2024 ............. H03H 9/725
(Continued)

OTHER PUBLICATIONS

International Search Report in PCT/JP2022/017510, mailed Jul. 5, 2022, 3 pages.

(Continued)

*Primary Examiner* — Pedro J Cuevas
(74) *Attorney, Agent, or Firm* — Keating & Bennett, LLP

(57) ABSTRACT

An acoustic wave device includes a piezoelectric film directly or indirectly provided on a high acoustic-velocity material layer, a dielectric film on the piezoelectric film, and an IDT electrode on the dielectric film. The dielectric film is made of one of silicon oxide, silicon nitride, alumina, and amorphous silicon. When a wavelength determined based on an electrode finger pitch of the IDT electrode is denoted as λ, a duty of the IDT electrode is denoted as y, and a film thickness normalized by the wavelength λ of the dielectric film is denoted as x (%), x and y are in each range of Table 1, Table 2, Table 3, or Table 4 below depending on a material of the dielectric film.

16 Claims, 5 Drawing Sheets

(56) References Cited

U.S. PATENT DOCUMENTS 12,113,509 B2* 10/2024 Nagatomo ......... H03H 9/02559
12,149,223 B2* 11/2024 Taniguchi .......... H03H 9/02228
12,191,839 B2* 1/2025 Iwamoto ............ H03H 9/02559
12,424,997 B2* 9/2025 Daimon ............. H03H 9/02157
12,512,809 B2* 12/2025 Iwamoto ............ H03H 9/02086
2012/0187799 A1* 7/2012 Nakahashi ......... H03H 9/14544 310/313 A
2018/0159497 A1* 6/2018 Iwamoto ............ H03H 9/02574
2019/0363697 A1 11/2019 Yamane
2020/0328728 A1 10/2020 Nakagawa et al.
2020/0328823 A1 10/2020 Nakagawa et al.
2020/0403603 A1* 12/2020 Daimon ............. H03H 9/14573
2022/0014175 A1* 1/2022 Nagatomo ......... H03H 9/14541
2022/0123711 A1* 4/2022 Taniguchi .......... H03H 9/02574
2022/0224311 A1* 7/2022 Daimon ............. H03H 9/02559
2022/0368305 A1* 11/2022 Iwamoto ............ H03H 9/14541
2022/0407493 A1* 12/2022 Iwamoto ............ H03H 9/02086
2023/0143523 A1* 5/2023 Miyamoto ......... H03H 9/02574 310/365
2023/0198500 A1* 6/2023 Okada ................ H03H 9/02559 310/365
2023/0208391 A1* 6/2023 Daimon ............. H03H 9/02574 310/363
2023/0261638 A1* 8/2023 Daimon ............. H03H 9/02574 310/313 R
2023/0353120 A1* 11/2023 Daimon ............. H03H 9/02031
2023/0370049 A1* 11/2023 Okada ................ H03H 9/02574
2023/0378932 A1* 11/2023 Okada ................ H03H 9/02574
2024/0243728 A1* 7/2024 Okada ................ H03H 9/02637
2024/0356522 A1* 10/2024 Ito .......................... H03H 9/725
2024/0396524 A1* 11/2024 Nakagawa ............... H03H 9/25
2024/0396525 A1* 11/2024 Nakagawa ............. H03H 9/132
2025/0096777 A1* 3/2025 Noguchi ............ H03H 9/02559
2025/0192753 A1* 6/2025 Kimura .............. H03H 9/02559
2025/0337385 A1* 10/2025 Iwamoto .................. H03H 9/64
2026/0031789 A1* 1/2026 Yanagitani ............... H03H 9/19

FOREIGN PATENT DOCUMENTS

JP 2015119258 A 6/2015
JP 7231015 B2 * 3/2023 ......... H03H 9/02866
WO 2018146883 A1 8/2018
WO 2019138810 A1 7/2019
WO 2019138812 A1 7/2019
WO WO-2022173038 A1 * 8/2022 ......... H03H 9/02031
WO WO-2023033032 A1 * 3/2023 ............. H03H 9/725

OTHER PUBLICATIONS

Written Opinion in PCT/JP2022/017510, mailed Jul. 5, 2022, 3 pages.

* cited by examiner

ACOUSTIC WAVE DEVICE

CROSS REFERENCE TO RELATED APPLICATIONS

This application claims the benefit of priority to Japanese Patent Application No. 2021-069675 filed on Apr. 16, 2021 and is a Continuation Application of PCT Application No. PCT/JP2022/017510 filed on Apr. 11, 2022. The entire contents of each application are hereby incorporated herein by reference.

BACKGROUND OF THE INVENTION

1. Field of the Invention

The present invention relates to an acoustic wave device in which a dielectric film is laminated between a piezoelectric film and an IDT electrode.

2. Description of the Related Art

In the acoustic wave device described in WO2019/138810, a high acoustic-velocity material layer, a low acoustic-velocity film, and a piezoelectric film are laminated on a support substrate. Further, a dielectric film is laminated on the piezoelectric film and an IDT electrode is provided on the dielectric film. Here, the duty of an IDT is set to 0.5. The structure including the high acoustic-velocity material layer and the low acoustic-velocity film can increase a Q value.

In acoustic wave devices such as that described in WO2019/138810, variations in the width of electrode fingers in an IDT electrode sometimes increases variations in fractional bandwidth. If the variations in the fractional bandwidth increase, VSWR characteristics may deteriorate in a surface acoustic wave filter using such an acoustic wave device as a resonator.

SUMMARY OF THE INVENTION

Preferred embodiments of the present invention provide acoustic wave devices each with reduced variations in fractional bandwidth caused by variations in widths of electrode fingers in an IDT electrode.

An acoustic wave device according to a preferred embodiment of the present invention includes a high acoustic-velocity material layer made of a high acoustic-velocity material, a piezoelectric film directly or indirectly provided on the high acoustic-velocity material layer, and an IDT electrode on the piezoelectric film. The high acoustic-velocity material is a material in which an acoustic velocity of a bulk wave propagating therethrough is higher than an acoustic velocity of an acoustic wave propagating through the piezoelectric film. The acoustic wave device further includes a dielectric film between the IDT electrode and the piezoelectric film. The dielectric film is made of silicon oxide, silicon nitride, alumina, or amorphous silicon. When a wavelength determined based on an electrode finger pitch of the IDT electrode is denoted as $\lambda$, a duty of the IDT electrode is denoted as y, and a film thickness normalized by the wavelength $\lambda$ of the dielectric film is denoted as x (%), the film thickness x of the dielectric film and the duty y of the IDT electrode are in a range of Table 1 below in a structure in which the dielectric film is made of silicon oxide, the film thickness x and the duty y are in a range of Table 2 below in a structure in which the dielectric film is made of silicon nitride, the film thickness x and the duty y are in a range of Table 3 below in a structure in which the dielectric film is made of alumina, and the film thickness x and the duty y are in a range of Table 4 below in a structure in which the dielectric film is made of amorphous silicon:

| TABLE 1 |
|---|
| When $0.2 \le x < 0.3$, $0.5 < y \le 0.51$ |
| When $0.3 \le x < 0.4$, $0.5 < y \le 0.54$ |
| When $0.4 \le x < 0.5$, $0.5 < y \le 0.58$ |
| When $0.5 \le x < 0.6$, $0.5 < y \le 0.61$ |
| When $0.6 \le x < 0.7$, $0.5 < y \le 0.64$ |
| When $0.7 \le x < 0.8$, $0.5 < y \le 0.66$ |
| When $0.8 \le x < 0.9$, $0.5 < y \le 0.67$ |
| When $0.9 \le x < 1.0$, $0.5 < y \le 0.69$ |
| When $1.0 \le x < 1.2$, $0.5 < y \le 0.70$ |
| When $1.2 \le x < 1.3$, $0.5 < y \le 0.71$ |
| When $1.3 \le x < 1.6$, $0.5 < y \le 0.72$ |
| When $1.6 \le x < 2.0$, $0.5 < y \le 0.73$ |
| When $2.0 \le x$, $0.5 < y \le 0.74$, |

| TABLE 2 |
|---|
| When $0.4 \le x < 0.5$, $0.5 < y \le 0.51$ |
| When $0.5 \le x < 0.6$, $0.5 < y \le 0.53$ |
| When $0.6 \le x < 0.7$, $0.5 < y \le 0.55$ |
| When $0.7 \le x < 0.8$, $0.5 < y \le 0.57$ |
| When $0.8 \le x < 0.9$, $0.5 < y \le 0.58$ |
| When $0.9 \le x < 1.0$, $0.5 < y \le 0.59$ |
| When $1.0 \le x < 1.1$, $0.5 < y \le 0.61$ |
| When $1.1 \le x < 1.2$, $0.5 < y \le 0.62$ |
| When $1.2 \le x < 1.3$, $0.5 < y \le 0.63$ |
| When $1.3 \le x < 1.5$, $0.5 < y \le 0.64$ |
| When $1.5 \le x < 1.7$, $0.5 < y \le 0.65$ |
| When $1.7 \le x < 2.0$, $0.5 < y \le 0.66$ |
| When $2.0 \le x < 2.7$, $0.5 < y \le 0.67$ |
| When $2.7 \le x$, $0.5 < y \le 0.68$, |

| TABLE 3 |
|---|
| When $0.5 \le x < 0.6$, $0.5 < y \le 0.52$ |
| When $0.6 \le x < 0.7$, $0.5 < y \le 0.53$ |
| When $0.7 \le x < 0.8$, $0.5 < y \le 0.54$ |
| When $0.8 \le x < 0.9$, $0.5 < y \le 0.56$ |
| When $0.9 \le x < 1.0$, $0.5 < y \le 0.57$ |
| When $1.0 \le x < 1.2$, $0.5 < y \le 0.59$ |
| When $1.2 \le x < 1.3$, $0.5 < y \le 0.60$ |
| When $1.3 \le x < 1.4$, $0.5 < y \le 0.61$ |
| When $1.4 \le x < 1.5$, $0.5 < y \le 0.62$ |
| When $1.5 \le x < 1.7$, $0.5 < y \le 0.63$ |
| When $1.7 \le x < 2.0$, $0.5 < y \le 0.64$ |
| When $2.0 \le x < 2.5$, $0.5 < y \le 0.65$ |
| When $2.5 \le x$, $0.5 < y \le 0.66$, |

and

| TABLE 4 |
|---|
| When $0.5 \le x < 0.6$, $0.5 < y \le 0.52$ |
| When $0.6 \le x < 0.7$, $0.5 < y \le 0.53$ |
| When $0.7 \le x < 0.8$, $0.5 < y \le 0.54$ |
| When $0.8 \le x < 0.9$, $0.5 < y \le 0.56$ |
| When $0.9 \le x < 1.0$, $0.5 < y \le 0.57$ |
| When $1.0 \le x < 1.1$, $0.5 < y \le 0.58$ |
| When $1.1 \le x < 1.2$, $0.5 < y \le 0.59$ |
| When $1.2 \le x < 1.3$, $0.5 < y \le 0.60$ |
| When $1.3 \le x < 1.4$, $0.5 < y \le 0.61$ |
| When $1.4 \le x < 1.5$, $0.5 < y \le 0.62$ |
| When $1.5 \le x < 1.7$, $0.5 < y \le 0.63$ |
| When $1.7 \le x < 2.0$, $0.5 < y \le 0.64$ |
| When $2.0 \le x < 2.7$, $0.5 < y \le 0.65$ |
| When $2.7 \le x$, $0.5 < y \le 0.66$. |

An acoustic wave device according to a preferred embodiment of the present invention may be an acoustic wave device including a high acoustic-velocity material layer made of a high acoustic-velocity material, a piezoelectric film directly or indirectly provided on the high acoustic-velocity material layer, and an IDT electrode on the piezoelectric film, wherein the high acoustic-velocity material is a material in which an acoustic velocity of a bulk wave propagating therethrough is higher than an acoustic velocity of an acoustic wave propagating through the piezoelectric film, the acoustic wave device further includes a dielectric film that is provided between the IDT electrode and the piezoelectric film, the dielectric film is made of silicon oxide, silicon nitride, alumina, or amorphous silicon, and when a wavelength determined based on an electrode finger pitch of the IDT electrode is denoted as λ, a duty of the IDT electrode is denoted as y, and a film thickness normalized by the wavelength λ of the dielectric film is denoted as x (%), the duty y of the IDT electrode and the film thickness x of the dielectric film are within a hatched area in FIG. 4, FIG. 5, FIG. 6, or FIG. 7 depending on a material of the dielectric film.

According to preferred embodiments of the present invention, acoustic wave devices each with reduced variations in fractional bandwidth caused by variations in the width of electrode fingers in an IDT electrode can be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing specific preferred embodiments of the present invention with reference to the accompanying drawings.

Each of the preferred embodiments described in the present specification is exemplary and configurations can be partially exchanged or combined with each other between different preferred embodiments.

Figure 1:
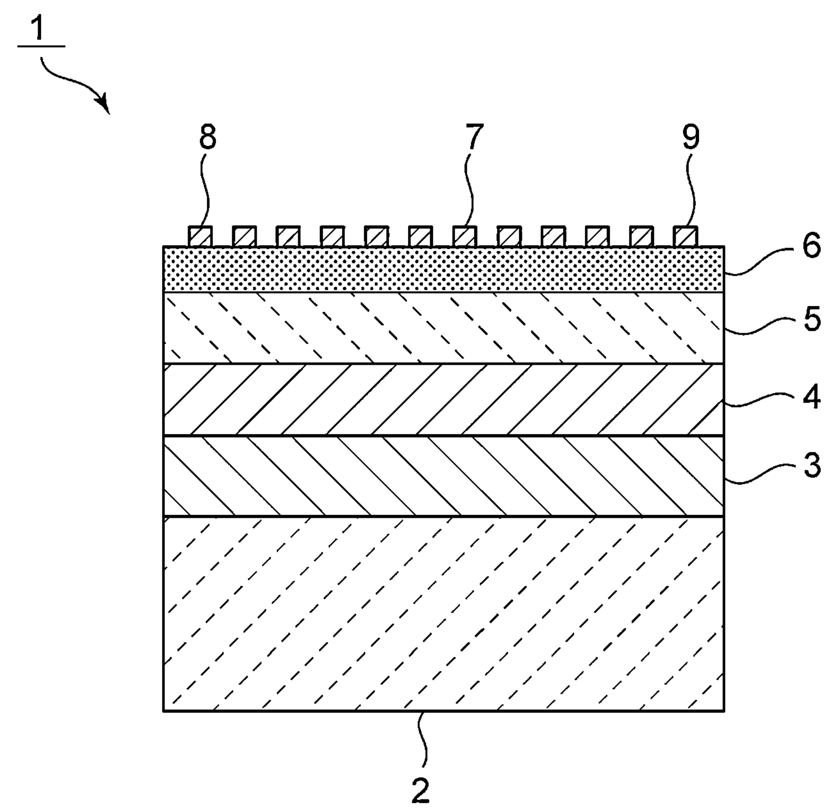
FIG. 1 is a front sectional view of an acoustic wave device according to a first preferred embodiment of the present invention.
Figure 2:
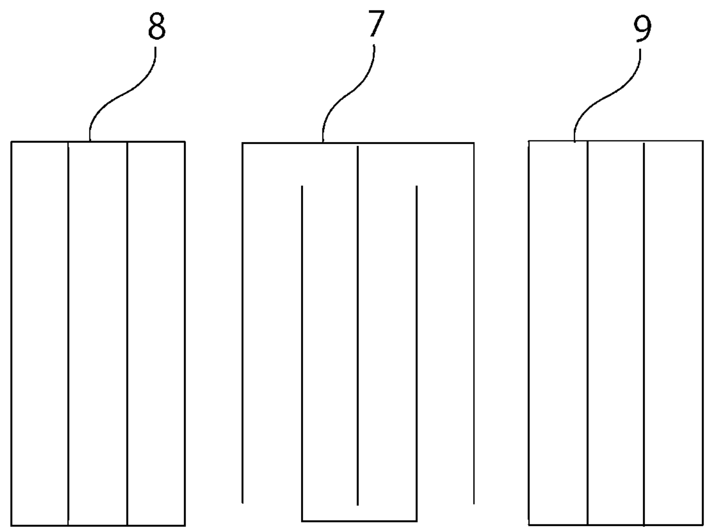
FIG. 2 is a schematic plan view illustrating an electrode structure of the acoustic wave device according to the first preferred embodiment of the present invention.

FIG. 1 is a front sectional view of an acoustic wave device according to a first preferred embodiment of the present invention, and FIG. 2 is a schematic plan view illustrating an electrode structure of the acoustic wave device.

In an acoustic wave device 1, a high acoustic-velocity material layer 3, a low acoustic-velocity film 4, and a piezoelectric film 5 are laminated on a support substrate 2. The support substrate 2 is made of Si, for example, but the material of the support substrate 2 is not particularly limited. Various insulators and semiconductors can be used as the material of the support substrate 2. In other words, the support substrate 2 is laminated on a surface, which is opposite to a surface on the piezoelectric film 5 side, of the high acoustic-velocity material layer 3.

The high acoustic-velocity material layer 3 is made of a high acoustic-velocity material. The high acoustic-velocity material is a material in which an acoustic velocity of a bulk wave propagating through this material is higher than an acoustic velocity of an acoustic wave propagating through the piezoelectric film 5. Examples of the high acoustic-velocity material may include various materials such as aluminum oxide, silicon carbide, silicon nitride, silicon oxynitride, silicon, sapphire, lithium tantalate, lithium niobate, crystal, alumina, zirconia, cordierite, mullite, steatite, forsterite, magnesia, diamond-like carbon (DLC) film, or diamond, a medium including the above-mentioned material as a main component, and a medium including a mixture of the above-mentioned materials as a main component. In the present preferred embodiment, the high acoustic-velocity material layer 3 is made of silicon nitride, for example.

The low acoustic-velocity film 4 is made of a low acoustic-velocity material. The low acoustic-velocity material may be an arbitrary material that has a lower acoustic velocity of a bulk wave than that of a bulk wave propagating through the piezoelectric film 5. Examples of such a low acoustic-velocity material may include various materials such as silicon oxide, glass, silicon oxynitride, tantalum oxide, a compound obtained by adding fluorine, carbon, boron, hydrogen, or a silanol group to silicon oxide, and a medium including the above-mentioned material as a main component. In the present preferred embodiment, the low acoustic-velocity film 4 is made of silicon oxide, for example.

The piezoelectric film 5 is made of lithium tantalate, for example. However, the piezoelectric film 5 may be made of other piezoelectric single crystals such as lithium niobate, for example.

The piezoelectric film 5 is laminated on the high acoustic-velocity material layer 3 and the low acoustic-velocity film 4 and therefore, a Q value can be increased in the acoustic wave device 1.

A dielectric film 6 is laminated on the piezoelectric film 5. The dielectric film 6 is made of, for example, silicon oxide ($SiO_2$) in the present preferred embodiment. However, the material of the dielectric film 6 is not limited to silicon oxide and may be, for example, silicon nitride, alumina, amorphous silicon, or the like.

The dielectric film 6, an IDT electrode 7, and reflectors 8 and 9 are provided on the piezoelectric film 5. The acoustic wave device 1 is a surface acoustic wave resonator having the above-described electrode structure.

In the acoustic wave device 1, when a wavelength determined based on an electrode finger pitch of the IDT electrode 7 is denoted as λ, duty of the IDT electrode 7 is denoted as y, and a film thickness normalized by the wavelength λ of the dielectric film 6 is denoted as x (%) in a structure in which the dielectric film 6 is made of silicon oxide, x and y are in each range shown in Table 5 below. This can reduce variation in fractional bandwidth caused by the width of the electrode fingers in the IDT electrode 7.

This will be more specifically described.

TABLE 5

| |
|---|
| When $0.2 \leq x < 0.3$, $0.5 < y \leq 0.51$ |
| When $0.3 \leq x < 0.4$, $0.5 < y \leq 0.54$ |
| When $0.4 \leq x < 0.5$, $0.5 < y \leq 0.58$ |
| When $0.5 \leq x < 0.6$, $0.5 < y \leq 0.61$ |
| When $0.6 \leq x < 0.7$, $0.5 < y \leq 0.64$ |
| When $0.7 \leq x < 0.8$, $0.5 < y \leq 0.66$ |
| When $0.8 \leq x < 0.9$, $0.5 < y \leq 0.67$ |
| When $0.9 \leq x < 1.0$, $0.5 < y \leq 0.69$ |
| When $1.0 \leq x < 1.2$, $0.5 < y \leq 0.70$ |
| When $1.2 \leq x < 1.3$, $0.5 < y \leq 0.71$ |
| When $1.3 \leq x < 1.6$, $0.5 < y \leq 0.72$ |
| When $1.6 \leq x < 2.0$, $0.5 < y \leq 0.73$ |
| When $2.0 \leq x$, $0.5 < y \leq 0.74$ |

The inventor of preferred embodiments of the present application has discovered that if the film thickness x of the dielectric film 6 and the duty y in the IDT electrode 7 are changed, variations in fractional bandwidth with respect to variations in width of electrode fingers changes in the acoustic wave device 1.

Figure 3:
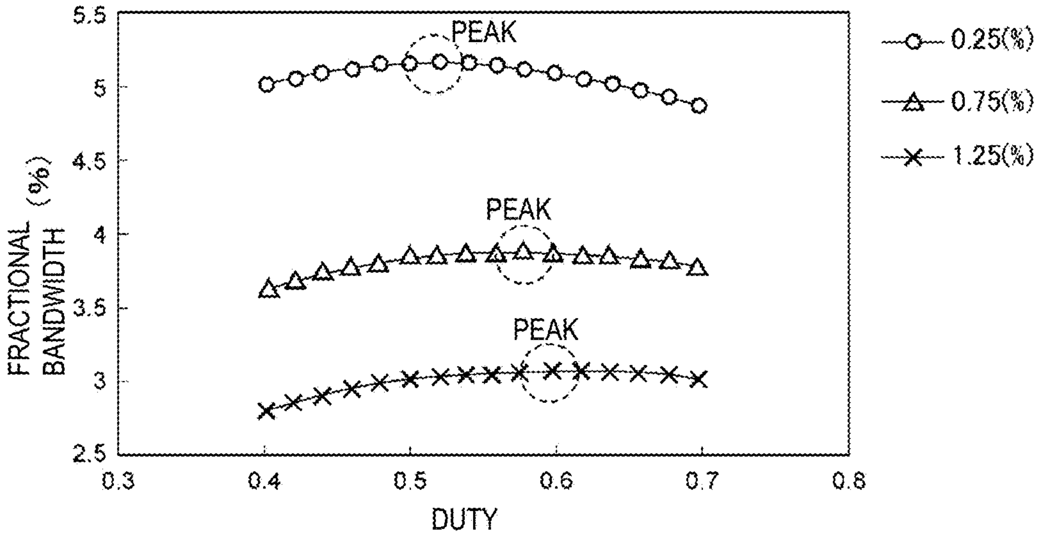
FIG. 3 is a diagram illustrating a relation among a film thickness of a dielectric film which is a silicon oxide film, duty, and fractional bandwidth.

FIG. 3 is a diagram illustrating respective relationship between the duty y of the IDT electrode 7 and fractional bandwidth (%) when the wavelength normalized film thickness of the dielectric film which is a silicon oxide film is about 0.25%, about 0.75%, and about 1.25%, for example. It can be seen that the fractional bandwidth changes as the duty changes whether the film thickness of the dielectric film 6 is about 0.25%, about 0.75%, or about 1.25%, and the largest fractional bandwidth is obtained at a certain duty value. Accordingly, when the duty approaches a peak on which the fractional bandwidth is the largest, the variation in duty, that is, the variation in the fractional bandwidth with respect to the variation in the width of the electrode fingers in the IDT electrode 7 is reduced.

Figure 4:
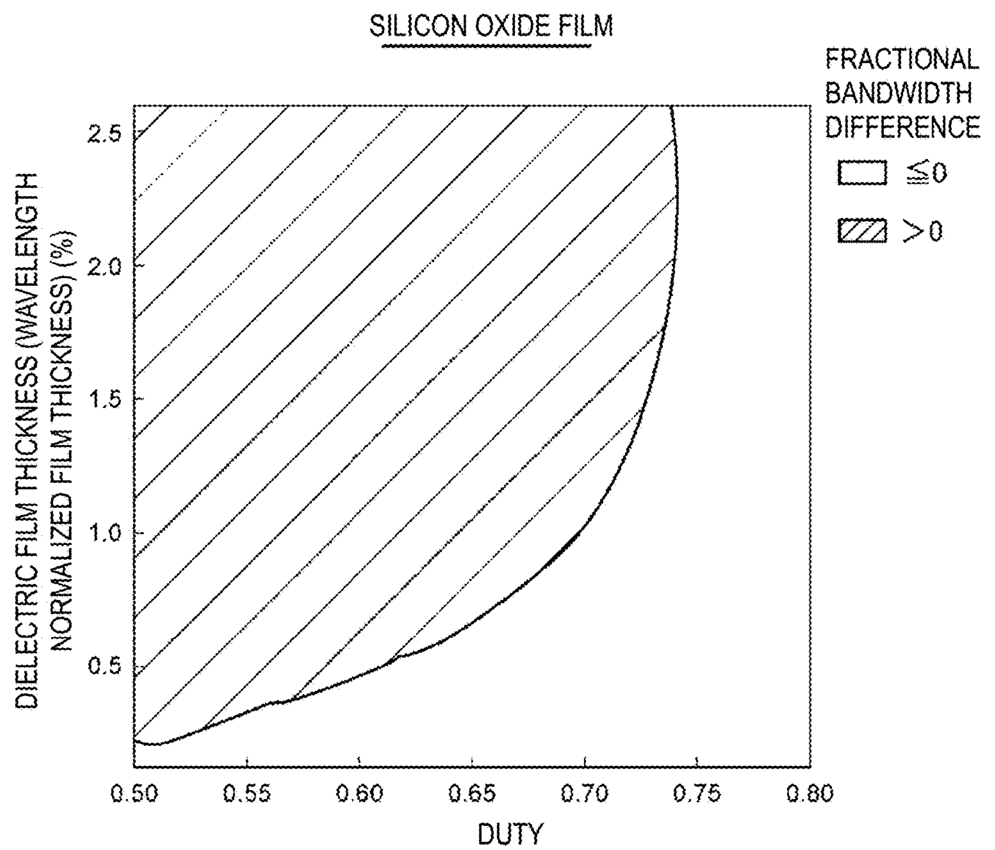
FIG. 4 is a diagram illustrating a relation among a film thickness of a dielectric film which is a silicon oxide film, duty in an IDT electrode, and fractional bandwidth.

A hatched area in FIG. 4 indicates an area in which the variations in the fractional bandwidth are small. More specifically, the hatched area is an area in which the fractional bandwidth becomes larger than the fractional bandwidth of the duty=about 0.5, depending on the film thickness of the silicon oxide film. That is, the hatched area indicates an area in which the fractional bandwidth becomes larger than the fractional bandwidth of the duty=about 0.5, depending on the film thickness x of the silicon oxide film. Within this hatched area, the variations in duty, that is, the variations in the fractional bandwidth with respect to the variations in the width of the electrode fingers in the IDT electrode can be reduced.

The ranges in Table 5 indicate the hatched area of FIG. 4.

Thus, when the dielectric film 6 is a silicon oxide film, it is sufficient that x and y are in each of the ranges shown in Table 5 above. This can effectively reduce variations in fractional bandwidth caused by variations in the width of electrode fingers.

The silicon oxide ($SiO_2$) film, for example, is used in the above-described preferred embodiment. However, as mentioned above, the dielectric film 6 may be, for example, a silicon nitride (SiN) film, an alumina ($Al_2O_3$) film, or an amorphous silicon (α-Si) film.

Figure 5:
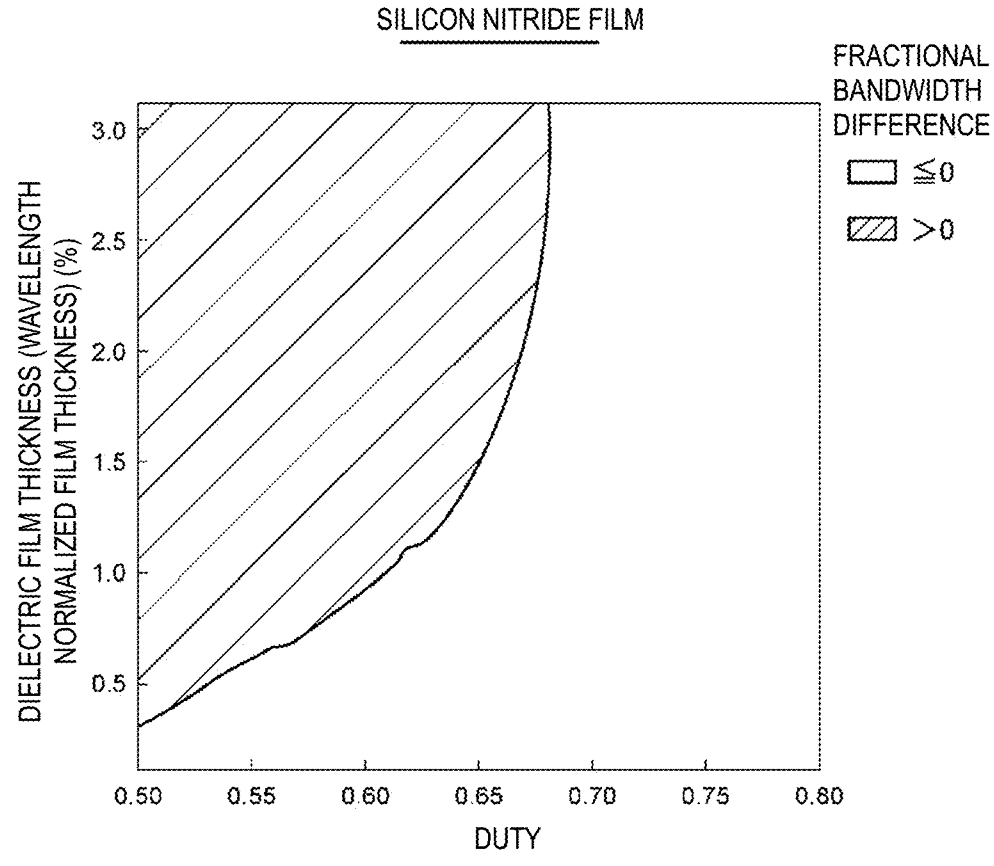
FIG. 5 is a diagram illustrating a relation among a film thickness of a dielectric film which is a silicon nitride film, duty in an IDT electrode, and fractional bandwidth.
Figure 6:
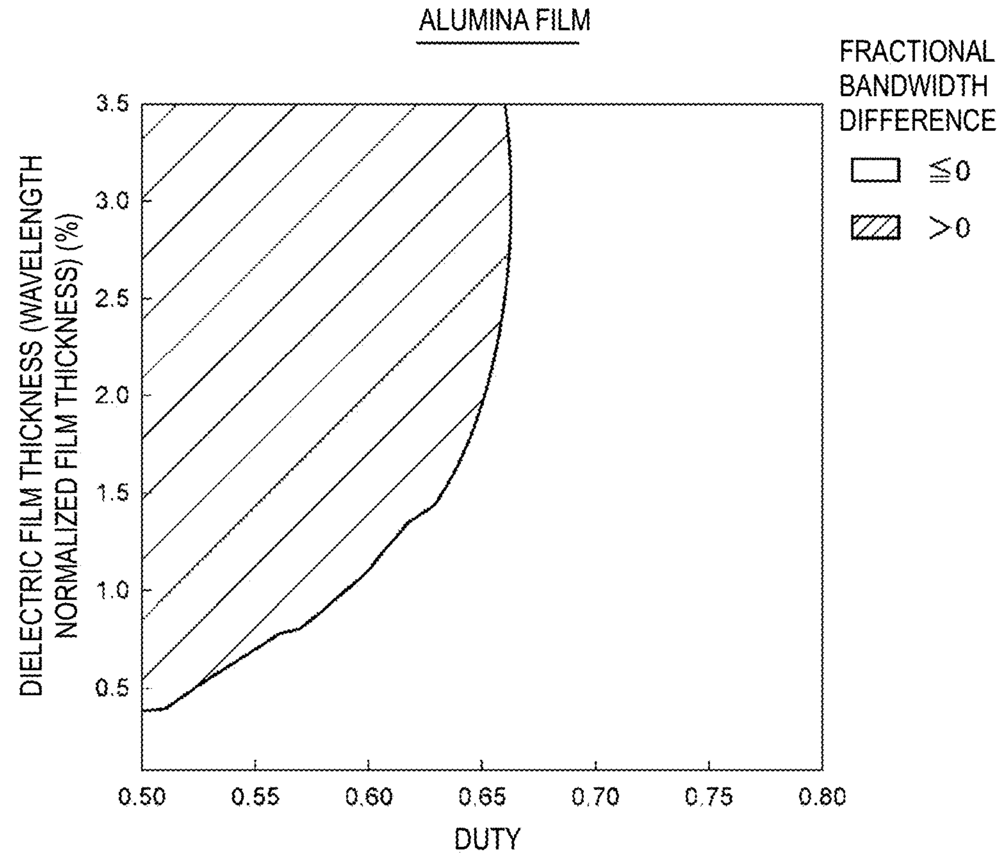
FIG. 6 is a diagram illustrating a relation among a film thickness of a dielectric film which is an alumina film, duty in an IDT electrode, and fractional bandwidth.
Figure 7:
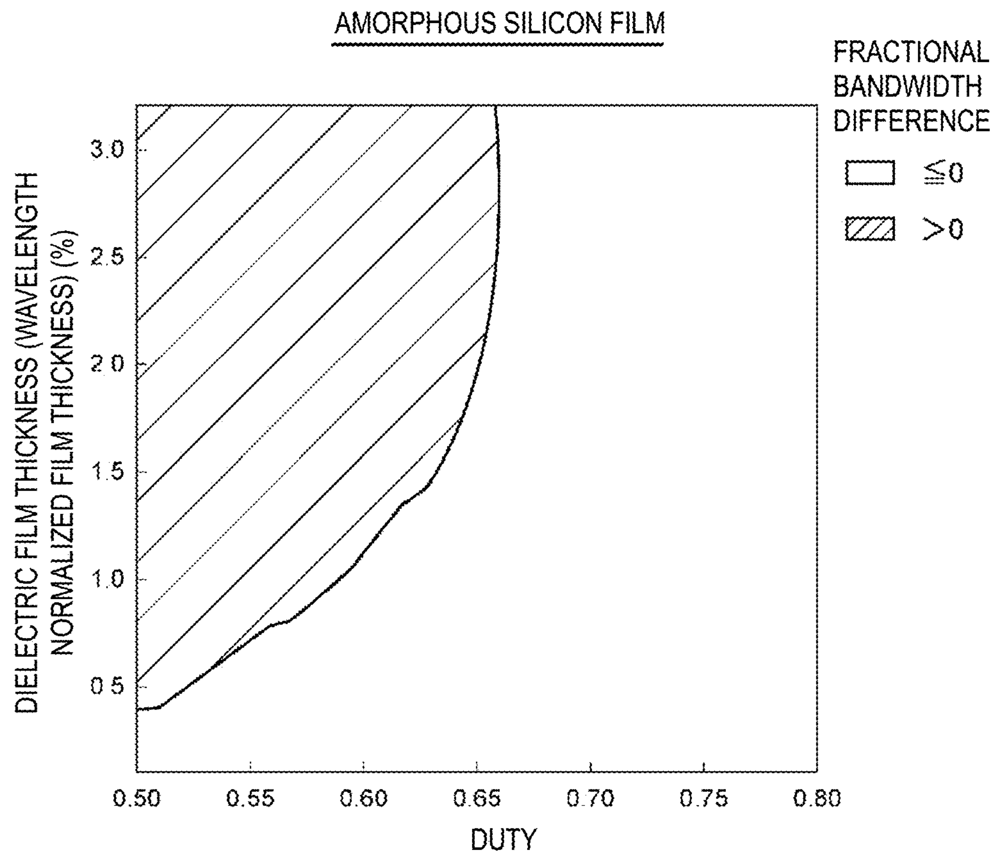
FIG. 7 is a diagram illustrating a relation among a film thickness of a dielectric film which is an amorphous silicon film, duty in an IDT electrode, and fractional bandwidth.

FIGS. 5, 6, and 7 are diagrams illustrating respective relationships among the duty y of the IDT electrode 7, the film thickness x of the dielectric film 6, and the fractional bandwidth when the dielectric film 6 is a silicon nitride film, an alumina film, and an amorphous silicon film. Also in FIGS. 5 to 7, a hatched area indicates a range where a fractional bandwidth difference from the fractional bandwidth of the duty=about 0.5 is greater than 0.

When the dielectric film 6 is a silicon nitride (SiN) film, the width of the fractional bandwidth caused by the variations in the width of the electrode fingers in the IDT electrode 7 can be effectively reduced in the hatched area of FIG. 5, that is, within the range of x and y shown in Table 6 below.

TABLE 6

| |
|---|
| When $0.4 \leq x < 0.5$, $0.5 < y \leq 0.51$ |
| When $0.5 \leq x < 0.6$, $0.5 < y \leq 0.53$ |
| When $0.6 \leq x < 0.7$, $0.5 < y \leq 0.55$ |
| When $0.7 \leq x < 0.8$, $0.5 < y \leq 0.57$ |
| When $0.8 \leq x < 0.9$, $0.5 < y \leq 0.58$ |
| When $0.9 \leq x < 1.0$, $0.5 < y \leq 0.59$ |
| When $1.0 \leq x < 1.1$, $0.5 < y \leq 0.61$ |
| When $1.1 \leq x < 1.2$, $0.5 < y \leq 0.62$ |
| When $1.2 \leq x < 1.3$, $0.5 < y \leq 0.63$ |
| When $1.3 \leq x < 1.5$, $0.5 < y \leq 0.64$ |
| When $1.5 \leq x < 1.7$, $0.5 < y \leq 0.65$ |
| When $1.7 \leq x < 2.0$, $0.5 < y \leq 0.66$ |
| When $2.0 \leq x < 2.7$, $0.5 < y \leq 0.67$ |
| When $2.7 \leq x$, $0.5 < y \leq 0.68$ |

When the dielectric film 6 is an alumina ($Al_2O_3$) film, it is sufficient that x and y are in the hatched area of FIG. 6, that is, within each range of x and y shown in Table 7 below. This can effectively reduce the variations in the fractional bandwidth caused by the variations in the width of the electrode fingers in the IDT electrode 7.

TABLE 7

| |
|---|
| When $0.5 \leq x < 0.6$, $0.5 < y \leq 0.52$ |
| When $0.6 \leq x < 0.7$, $0.5 < y \leq 0.53$ |
| When $0.7 \leq x < 0.8$, $0.5 < y \leq 0.54$ |
| When $0.8 \leq x < 0.9$, $0.5 < y \leq 0.56$ |
| When $0.9 \leq x < 1.0$, $0.5 < y \leq 0.57$ |
| When $1.0 \leq x < 1.2$, $0.5 < y \leq 0.59$ |
| When $1.2 \leq x < 1.3$, $0.5 < y \leq 0.60$ |
| When $1.3 \leq x < 1.4$, $0.5 < y \leq 0.61$ |
| When $1.4 \leq x < 1.5$, $0.5 < y \leq 0.62$ |
| When $1.5 \leq x < 1.7$, $0.5 < y \leq 0.63$ |
| When $1.7 \leq x < 2.0$, $0.5 < y \leq 0.64$ |
| When $2.0 \leq x < 2.5$, $0.5 < y \leq 0.65$ |
| When $2.5 \leq x$, $0.5 < y \leq 0.66$ |

When the dielectric film 6 is an amorphous silicon (α-Si) film, it is sufficient that x and y are in the hatched area of FIG. 7, that is, within each range of x and y shown in Table 8 below. This can effectively reduce the variations in the fractional bandwidth caused by the variations in the width of the electrode fingers in the IDT electrode 7.

TABLE 8

| |
|---|
| When $0.5 \leq x < 0.6$, $0.5 < y \leq 0.52$ |
| When $0.6 \leq x < 0.7$, $0.5 < y \leq 0.53$ |
| When $0.7 \leq x < 0.8$, $0.5 < y \leq 0.54$ |
| When $0.8 \leq x < 0.9$, $0.5 < y \leq 0.56$ |
| When $0.9 \leq x < 1.0$, $0.5 < y \leq 0.57$ |
| When $1.0 \leq x < 1.1$, $0.5 < y \leq 0.58$ |
| When $1.1 \leq x < 1.2$, $0.5 < y \leq 0.59$ |
| When $1.2 \leq x < 1.3$, $0.5 < y \leq 0.60$ |
| When $1.3 \leq x < 1.4$, $0.5 < y \leq 0.61$ |
| When $1.4 \leq x < 1.5$, $0.5 < y \leq 0.62$ |
| When $1.5 \leq x < 1.7$, $0.5 < y \leq 0.63$ |
| When $1.7 \leq x < 2.0$, $0.5 < y \leq 0.64$ |
| When $2.0 \leq x < 2.7$, $0.5 < y \leq 0.65$ |
| When $2.7 \leq x$, $0.5 < y \leq 0.66$ |

Figure 8:
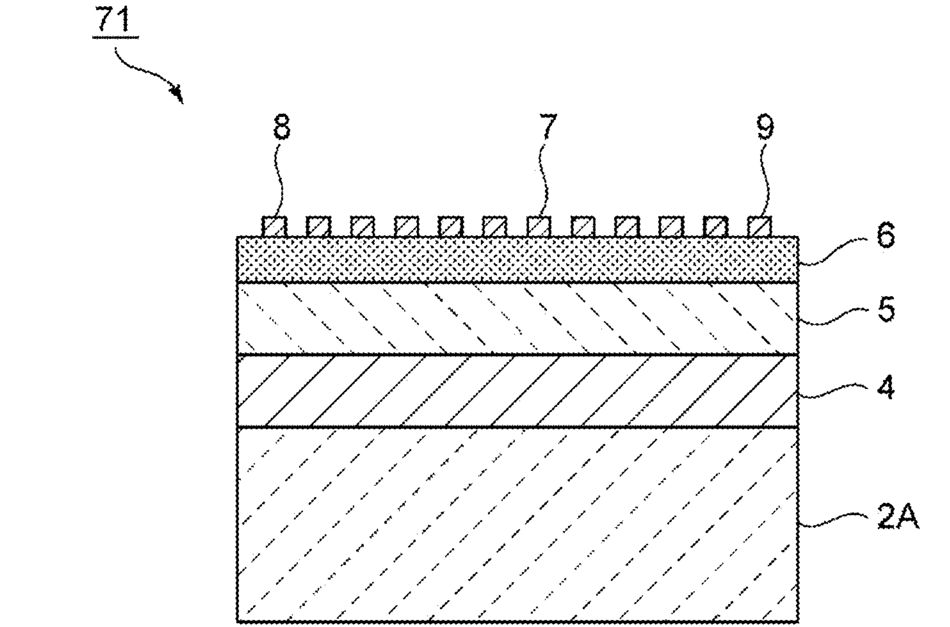
FIG. 8 is a front sectional view of an acoustic wave device according to a second preferred embodiment of the present invention.

FIG. 8 is a front sectional view of an acoustic wave device according to a second preferred embodiment of the present invention. In an acoustic wave device 71, the low acoustic-velocity film 4 and the piezoelectric film 5 are laminated on a support substrate 2A. That is, the high acoustic-velocity material layer 3 illustrated in FIG. 1 is not used. Here, the support substrate 2A is made of a high acoustic-velocity material in the acoustic wave device 71. That is, the support substrate 2A corresponds to a structure in which the support substrate 2 illustrated in FIG. 1 and the high acoustic-velocity material layer 3 are integrated with each other. Thus, when the support substrate 2A made of a high acoustic-velocity material is used, the high acoustic-velocity material layer 3 may be omitted. Further, the low acoustic-velocity film 4 may be omitted in the acoustic wave devices 1 and 71. In other words, the piezoelectric film 5 may be directly laminated on the high acoustic-velocity material layer 3 or the support substrate 2A made of a high acoustic-velocity material.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a high acoustic-velocity material layer made of a high acoustic-velocity material;

a piezoelectric film directly or indirectly provided on the high acoustic-velocity material layer; and an IDT electrode on the piezoelectric film; wherein the high acoustic-velocity material is a material in which an acoustic velocity of a bulk wave propagating therethrough is higher than an acoustic velocity of an acoustic wave propagating through the piezoelectric film;

the acoustic wave device further includes a dielectric film between the IDT electrode and the piezoelectric film; and the dielectric film is made of one of silicon oxide, silicon nitride, alumina, and amorphous silicon, and when a wavelength determined based on an electrode finger pitch of the IDT electrode is denoted as λ, a duty of the IDT electrode is denoted as y, and a film thickness normalized by the wavelength λ of the dielectric film is denoted as x (%), the film thickness x of the dielectric film and the duty y of the IDT electrode are in a range of Table 1 below in a structure in which the dielectric film is made of silicon oxide, the film thickness x and the duty y are in a range of Table 2 below in a structure in which the dielectric film is made of silicon nitride, the film thickness x and the duty y are in a range of Table 3 below in a structure in which the dielectric film is made of alumina, and the film thickness x and the duty y are in a range of Table 4 below in a structure in which the dielectric film is made of amorphous silicon:

TABLE 1

| |
|---|
| When 0.2 ≤ x < 0.3, 0.5 < y ≤ 0.51 |
| When 0.3 ≤ x < 0.4, 0.5 < y ≤ 0.54 |
| When 0.4 ≤ x < 0.5, 0.5 < y ≤ 0.58 |
| When 0.5 ≤ x < 0.6, 0.5 < y ≤ 0.61 |
| When 0.6 ≤ x < 0.7, 0.5 < y ≤ 0.64 |
| When 0.7 ≤ x < 0.8, 0.5 < y ≤ 0.66 |
| When 0.8 ≤ x < 0.9, 0.5 < y ≤ 0.67 |
| When 0.9 ≤ x < 1.0, 0.5 < y ≤ 0.69 |
| When 1.0 ≤ x < 1.2, 0.5 < y ≤ 0.70 |
| When 1.2 ≤ x < 1.3, 0.5 < y ≤ 0.71 |
| When 1.3 ≤ x < 1.6, 0.5 < y ≤ 0.72 |
| When 1.6 ≤ x < 2.0, 0.5 < y ≤ 0.73 |
| When 2.0 ≤ x, 0.5 < y ≤ 0.74; |

TABLE 2

| |
|---|
| When 0.4 ≤ x < 0.5, 0.5 < y ≤ 0.51 |
| When 0.5 ≤ x < 0.6, 0.5 < y ≤ 0.53 |
| When 0.6 ≤ x < 0.7, 0.5 < y ≤ 0.55 |
| When 0.7 ≤ x < 0.8, 0.5 < y ≤ 0.57 |
| When 0.8 ≤ x < 0.9, 0.5 < y ≤ 0.58 |
| When 0.9 ≤ x < 1.0, 0.5 < y ≤ 0.59 |
| When 1.0 ≤ x < 1.1, 0.5 < y ≤ 0.61 |
| When 1.1 ≤ x < 1.2, 0.5 < y ≤ 0.62 |
| When 1.2 ≤ x < 1.3, 0.5 < y ≤ 0.63 |
| When 1.3 ≤ x < 1.5, 0.5 < y ≤ 0.64 |
| When 1.5 ≤ x < 1.7, 0.5 < y ≤ 0.65 |
| When 1.7 ≤ x < 2.0, 0.5 < y ≤ 0.66 |
| When 2.0 ≤ x < 2.7, 0.5 < y ≤ 0.67 |
| When 2.7 ≤ x, 0.5 < y ≤ 0.68; |

TABLE 3

| |
|---|
| When 0.5 ≤ x < 0.6, 0.5 < y ≤ 0.52 |
| When 0.6 ≤ x < 0.7, 0.5 < y ≤ 0.53 |
| When 0.7 ≤ x < 0.8, 0.5 < y ≤ 0.54 |
| When 0.8 ≤ x < 0.9, 0.5 < y ≤ 0.56 |
| When 0.9 ≤ x < 1.0, 0.5 < y ≤ 0.57 |
| When 1.0 ≤ x < 1.2, 0.5 < y ≤ 0.59 |
| When 1.2 ≤ x < 1.3, 0.5 < y ≤ 0.60 |
| When 1.3 ≤ x < 1.4, 0.5 < y ≤ 0.61 |
| When 1.4 ≤ x < 1.5, 0.5 < y ≤ 0.62 |
| When 1.5 ≤ x < 1.7, 0.5 < y ≤ 0.63 |
| When 1.7 ≤ x < 2.0, 0.5 < y ≤ 0.64 |
| When 2.0 ≤ x < 2.5, 0.5 < y ≤ 0.65 |
| When 2.5 ≤ x, 0.5 < y ≤ 0.66; |

and

TABLE 4

| |
|---|
| When 0.5 ≤ x < 0.6, 0.5 < y ≤ 0.52 |
| When 0.6 ≤ x < 0.7, 0.5 < y ≤ 0.53 |
| When 0.7 ≤ x < 0.8, 0.5 < y ≤ 0.54 |
| When 0.8 ≤ x < 0.9, 0.5 < y ≤ 0.56 |
| When 0.9 ≤ x < 1.0, 0.5 < y ≤ 0.57 |
| When 1.0 ≤ x < 1.1, 0.5 < y ≤ 0.58 |
| When 1.1 ≤ x < 1.2, 0.5 < y ≤ 0.59 |
| When 1.2 ≤ x < 1.3, 0.5 < y ≤ 0.60 |
| When 1.3 ≤ x < 1.4, 0.5 < y ≤ 0.61 |
| When 1.4 ≤ x < 1.5, 0.5 < y ≤ 0.62 |
| When 1.5 ≤ x < 1.7, 0.5 < y ≤ 0.63 |
| When 1.7 ≤ x < 2.0, 0.5 < y ≤ 0.64 |
| When 2.0 ≤ x < 2.7, 0.5 < y ≤ 0.65 |
| When 2.7 ≤ x, 0.5 < y ≤ 0.66. |

2. The acoustic wave device according to claim 1, further comprising a support substrate laminated on a surface of the high acoustic-velocity material layer opposite to a surface on a piezoelectric film side of the high acoustic-velocity material layer.

3. The acoustic wave device according to claim 2, further comprising:

a low acoustic-velocity film laminated between the high acoustic-velocity material layer and the piezoelectric film and made of a low acoustic-velocity material; wherein the low acoustic-velocity material is a material in which an acoustic velocity of a bulk wave propagating therethrough is lower than an acoustic velocity of a bulk wave propagating through the piezoelectric film.

4. The acoustic wave device according to claim 3, wherein the low acoustic-velocity material is made of silicon oxide.

5. The acoustic wave device according to claim 2, wherein the support substrate is made of the high acoustic-velocity material, and the support substrate and the high acoustic-velocity material layer are integrated with each other.

6. The acoustic wave device according to claim 1, wherein the support substrate is made of Si.

7. The acoustic wave device according to claim 1, wherein the high acoustic-velocity material is made of silicon nitride.

8. The acoustic wave device according to claim 1, wherein the piezoelectric film is made of lithium tantalate.

9. An acoustic wave device comprising:

a high acoustic-velocity material layer made of a high acoustic-velocity material;

a piezoelectric film directly or indirectly on the high acoustic-velocity material layer; and an IDT electrode on the piezoelectric film; wherein the high acoustic-velocity material is a material in which an acoustic velocity of a bulk wave propagating therethrough is higher than an acoustic velocity of an acoustic wave propagating through the piezoelectric film;

the acoustic wave device further includes a dielectric film between the IDT electrode and the piezoelectric film; and the dielectric film is made of one of silicon oxide, silicon nitride, alumina, and amorphous silicon, and when a wavelength determined based on an electrode finger pitch of the IDT electrode is denoted as λ, duty of the IDT electrode is denoted as y, and a film thickness normalized by the wavelength λ of the dielectric film is denoted as x (%), the duty y of the IDT electrode and the film thickness x of the dielectric film are within a hatched area in FIG. 4 when the dielectric film is made of silicon oxide, FIG. 5 when the dielectric film is made of silicon nitride, FIG. 6 when the dielectric film is made of alumina, and FIG. 7 when the dielectric film is made of amorphous silicon.

10. The acoustic wave device according to claim 9, further comprising a support substrate laminated on a surface of the high acoustic-velocity material layer opposite to a surface on a piezoelectric film side of the high acoustic-velocity material layer.

11. The acoustic wave device according to claim 10, further comprising:

a low acoustic-velocity film laminated between the high acoustic-velocity material layer and the piezoelectric film and made of a low acoustic-velocity material; wherein the low acoustic-velocity material is a material in which an acoustic velocity of a bulk wave propagating therethrough is lower than an acoustic velocity of a bulk wave propagating through the piezoelectric film.

12. The acoustic wave device according to claim 11, wherein the low acoustic-velocity material is made of silicon oxide.

13. The acoustic wave device according to claim 10, wherein the support substrate is made of the high acoustic-velocity material, and the support substrate and the high acoustic-velocity material layer are integrated with each other.

14. The acoustic wave device according to claim 9, wherein the support substrate is made of Si.

15. The acoustic wave device according to claim 9, wherein the high acoustic-velocity material is made of silicon nitride.

16. The acoustic wave device according to claim 9, wherein the piezoelectric film is made of lithium tantalate.

* * * * *